(12) United States Patent
Sato

(10) Patent No.: US 7,183,828 B2
(45) Date of Patent: Feb. 27, 2007

(54) SHIFT CLOCK GENERATOR, TIMING GENERATOR AND TEST APPARATUS

(75) Inventor: Shinya Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/332,838

(22) Filed: Jan. 13, 2006

(65) Prior Publication Data

US 2006/0195741 A1 Aug. 31, 2006

Related U.S. Application Data

(63) Continuation of application No. PCT/JP2004/010113, filed on Jul. 15, 2004.

(30) Foreign Application Priority Data

Jul. 16, 2003 (JP) .............................. 2003-275267

(51) Int. Cl.
*H03H 11/16* (2006.01)
*H03H 11/26* (2006.01)

(52) U.S. Cl. ...................... 327/233; 327/234; 327/237; 327/276

(58) Field of Classification Search ...................... None
See application file for complete search history.

(56) References Cited

U.S. PATENT DOCUMENTS 5,964,894 A 10/1999 Kurihara 6,138,259 A * 10/2000 Tsuto .......................... 714/738
6,420,921 B1 7/2002 Okayasu et al.
6,597,753 B1 7/2003 Okayasu et al.
7,034,723 B2 * 4/2006 Suda et al. .................. 341/122

FOREIGN PATENT DOCUMENTS

EP 0 420 667 A2 4/1991
JP 11-38095 2/1999

OTHER PUBLICATIONS

International Search Report issued for PCT/JP2004/010113 mailed on Oct. 26, 2004 and English translation thereof, 4 pages.
Patent Abstracts of Japan, Publication No. 11-038095, Publication Date: Feb. 12, 1999, 2 pages.
Supplementary European Search Report issued in European Application No. EP 04 74 7579 dated May 15, 2006, 3 pages.

* cited by examiner

*Primary Examiner*—Tuan T. Lam
(74) *Attorney, Agent, or Firm*—Osha•Liang LLP

(57) ABSTRACT

There is provided a shift clock generator for phase-shifting a shift clock by inserting insertion pulses into the shift clock, wherein an insertion pulse generating section has a compensation memory for storing compensation data for calculating a number of insertion pulses to be inserted into the shift clock with respect to a phase difference preset value based on a phase shift amount, a number-of-pulses calculating section for integrating the compensation data stored in an address range of the compensation memory to calculate a number-of-insertion pulses data based on the phase difference preset value and a pulse generating section for generating the insertion pulses based on the number-of-insertion pulses data.

10 Claims, 7 Drawing Sheets

| ADDRESS | COMPENSATION DATA |
| --- | --- |
| 1 | 1 |
| 2 | 0 |
| 3 | 1 |
| 4 | 1 |
| 5 | 0 |
| 6 | 2 |
| 7 | 1 |
| 8 | 1 |
| 9 | 2 |
| 10 | 2 |
| 11 | 1 |
| 12 | 1 |
| 13 | 1 |
| 14 | 1 |
| ⋮ | ⋮ |

*FIG. 6*

Shift Clock Generator, Timing Generator and Test Apparatus

CROSS REFERENCE TO RELATED APPLICATION

This is a continuation application of PCT/JP2004/010113 filed in PC on Jul. 15, 2004 which claims priority from a Japanese Patent Application No. JP 2003-275267 filed on Jul. 16, 2003, the contents of which are incorporated herein by reference.

BACKGROUND OF THE INVENTION

1. Field of the Invention

The present invention relates to a shift clock generator for generating a shift clock, a timing generator for generating predetermined timing and a test apparatus for testing electronic devices.

2. Related Art

Conventionally, a test apparatus for testing electronic devices such as a semiconductor device is provided with a timing generator for generating predetermined timing. For example, the test apparatus supplies a test pattern to the electronic device with the timing generated by the timing generator. The timing generator generates the predetermined timing by receiving a reference clock and by delaying the reference clock by a predetermined time.

The timing generator has a variable delay circuit section for receiving the reference clock and for delaying the reference clock by the predetermined time and a linearize memory for controlling a value of delay in the variable delay circuit section for example. The variable delay circuit section has a plurality of delay elements in general. The linearize memory stores a delay preset value corresponding to linearization of the predetermined value of delay in the variable delay circuit section. Based on the data stored in the linearize memory, the variable delay circuit section delays the reference clock by passing the reference clock through a route of predetermined delay elements. Although the data stored in the linearize memory is set in advance by design information of the plurality of delay elements, an error occurs between the value of delay in the variable delay circuit section and the delay preset value which is the predetermined value of delay due to dispersion in manufacturing the plurality of delay elements and to ambient temperature in using the delay elements for example.

Conventionally, in order to compensate the error, a shift clock having a phase which is different from that of the the reference clock by a predetermined value is generated and the shift clock is outputted to the outside to measure a compensation value of the value of delay of the shift clock by using a measuring instrument and to linearize the value of delay. The shift clock is compared with the output of the variable delay circuit section to detect the error of the value of delay and to select the data to be stored in the linearize memory based on the error.

Presently, the present applicant is unaware of related patent documents, so that description thereof will be omitted here.

Conventionally, in order to generate the shift clock having the predetermined phase difference from the reference clock, pulses are inputted to the shift clock to phase-shift the shift clock by a method as described later in connection with FIGS. 3 and 4. Conventionally, the shift clock is phase-shifted by counting pulses of the shift clock and by inserting insertion pulses per predetermined count. However, there is a case when the phase shift amount of the shift clock does not change linearly with respect to the number of insertion pulses and this method causes an error in the phase shift amount of the shift clock when the phase shift amount of the shift clock does not change linearly with respect to the number of insertion pulses.

There is also a method of using a memory for storing a number of pulses to be inserted per predetermined phase shift amount in order to eliminate such error. However, in order to accurately measure the value of delay in the variable delay circuit section, resolution of the phase shift amount must be increased and a memory having a wide range of addresses is required. Still more, the number of pulses to be inserted must be stored in each address. Because the number of pulses to be inserted is normally around one to several thousands and such memory must have several tens bits in each address, a memory having a large capacity is required.

SUMMARY OF THE INVENTION

The present invention was made to solve the problems accompanying the conventional arts.

In order to solve the above-mentioned problems, according to a first aspect of the invention, there is provided a shift clock generator for generating a shift clock having a phase difference equal to a phase difference preset value set in advance from a reference clock, having a clock generating section for generating the shift clock, an insertion pulse generating section for generating insertion pulses to be inserted into the shift clock based on the phase difference preset value, a pulse inserting section for inserting the insertion pulses into the shift clock generated by the clock generating section and a period control section for controlling period of the shift clock generated by the clock generating section based on a difference between a sum of time during which the reference clock presents a predetermined logical value within a predetermined time and a sum of time during which the shift clock presents a predetermined logical value within the predetermined time, wherein the insertion pulse generating section has a compensation memory for storing compensation data for calculating a number of insertion pulses to be inserted into the shift clock with respect to the phase difference preset value, a number-of-pulses calculating section for integrating the compensation data stored in an address range of the compensation memory to calculate number-of-insertion pulses data based on the phase difference preset value and a pulse generating section for generating the insertion pulses based on the number-of-insertion pulses data.

The compensation memory may store the compensation data presenting a predetermined integer in each address.

The pulse calculating section has an address control section for sequentially generating address pointer signals specifying addresses of the compensation memory in which the compensation data is stored based on the phase difference preset value and an integrating section for integrating the compensation data outputted from the compensation memory based on the address pointer signal.

The address control section may include a first adder for feeding the address pointer signal to the compensation memory and a first storage section for storing the address pointer signal outputted from the first adder and may receive a first control signal based on the phase difference preset value and a second control signal based on a predetermined clock signal. The first storage section may sequentially feed the stored address pointer signals to the first adder corresponding to changes of value of the second control signal when the first control signal presents a predetermined value, and the first adder may generate a signal in which a predetermined value is added to the address pointer signal received from the first storage section as a new address pointer signal and may feed the newly generated address pointer signal to the compensation memory and the first storage section.

The predetermined clock signal is the reference clock or the shift clock. The integrating section may include a second adder for receiving the compensation data sequentially outputted from the compensation memory to output integrated data in which the compensation data is integrated and a second storage section for storing the integrated data outputted from the second adder, wherein the second storage section may feed the stored integrated data to the second adder corresponding to changes of value of the second control signal when the first control signal presents a predetermined value and the second adder may add the new compensation data outputted from the compensation memory corresponding to the new address pointer signal to the integrated data received from the second storage section and outputs it as the new integrated data.

The first storage section may be a flip-flop that receives the address pointer signal from the first adder, outputs the address pointer signal received from the first adder to the first adder by being triggered by the second control signal and receives the first control signal as an enable signal for controlling the operation of the first storage section, and the second storage section may be a flip-flop that receives AND of the first control signal and the integrated data outputted from the second adder and outputs AND of the first control signal and the integrated data outputted from the second adder to the second adder by being triggered by the second control signal.

According to a second aspect of the invention, there is provided a timing generator for generating predetermined timing, having a variable delay circuit section for receiving a reference clock and delaying the reference clock based on a predetermined delay preset value to output as the predetermined timing, a shift clock generator for generating a shift clock having a phase difference equal to a phase difference preset value based on the delay preset value from the reference clock and a comparing section for comparing the reference clock delayed by the variable delay circuit section with a phase of the shift clock to regulate the value of delay in the variable delay circuit section based on the comparison result. The shift clock generator has a clock generating section for generating the shift clock, an insertion pulse generating section for generating insertion pulses to be inserted into the shift clock based on the phase difference preset value, a pulse inserting section for inserting the insertion pulses into the shift clock generated by the clock generating section and a period control section for controlling period of the shift clock generated by the clock generating section based on a difference between a sum of time during which the reference clock presents a predetermined logical value within a predetermined time and a sum of time during which the shift clock presents a predetermined logical value within the predetermined time. The insertion pulse generating section may include a compensation memory for storing compensation data for calculating a number of insertion pulses to be inserted into the shift clock with respect to the phase difference preset value, a number-of-pulses calculating section for integrating the compensation data stored in an address range of the compensation memory to calculate number-of-insertion pulses data based on the phase difference preset value and a pulse generating section for generating the insertion pulses based on the number-of-insertion pulses data.

According to a third aspect of the invention, there is provided a test apparatus for testing an electronic device, having a pattern generating section for generating a test pattern for testing the electronic device, a timing generator for generating predetermined timing, a waveform shaping section for shaping the test pattern to feed the test pattern shaped based on the predetermined timing to the electronic device and a judging section for judging whether or not the electronic device is defect-free based on an output signal outputted from the electronic device based on the test pattern. The timing generator may include a variable delay circuit section for receiving a reference clock and delaying the reference clock based on a predetermined delay preset value to output as the predetermined timing, a shift clock generator for generating a shift clock having a phase difference equal to a phase difference preset value based on the delay preset value from the reference clock and a comparing section for comparing the reference clock delayed by the variable delay circuit section with a phase of the shift clock to regulate the value of delay in the variable delay circuit section based on the comparison result. The shift clock generator may have a clock generating section for generating the shift clock, an insertion pulse generating section for generating insertion pulses to be inserted into the shift clock based on the phase difference preset value, a pulse inserting section for inserting the insertion pulses into the shift clock generated by the clock generating section and a period control section for controlling period of the shift clock generated by the clock generating section based on a difference between a sum of time during which the reference clock presents a predetermined logical value within a predetermined time and a sum of time during which the shift clock presents a predetermined logical value within the predetermined time, wherein the insertion pulse generating section may include a compensation memory for storing compensation data for calculating a number of insertion pulses to be inserted into the shift clock with respect to the phase difference preset value, a number-of-pulses calculating section for integrating the compensation data stored in an address range of the compensation memory to calculate number-of-insertion pulses data based on the phase difference preset value and a pulse generating section for generating the insertion pulses based on the number-of-insertion pulses data.

It is noted that the summary of the invention described above does not necessarily describe all necessary features of the invention. The invention may also be a sub-combination of the features described above.

Thus, the invention allows a memory capacity to be reduced and the shift clock whose phase shift amount is accurately controlled to be generated. Still more, the timing generator can generate the predetermined timing accurately because the value of delay of the variable delay circuit section may be regulated based on the accurate shift clock. Furthermore, because the test apparatus carries out a test of electronic devices by using the accurate and predetermined timing, it can accurately test the electronic devices.

BRIEF DESCRIPTION OF THE DRAWINGS

FIG. 6 is a table showing one exemplary compensation data stored in a compensation memory.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
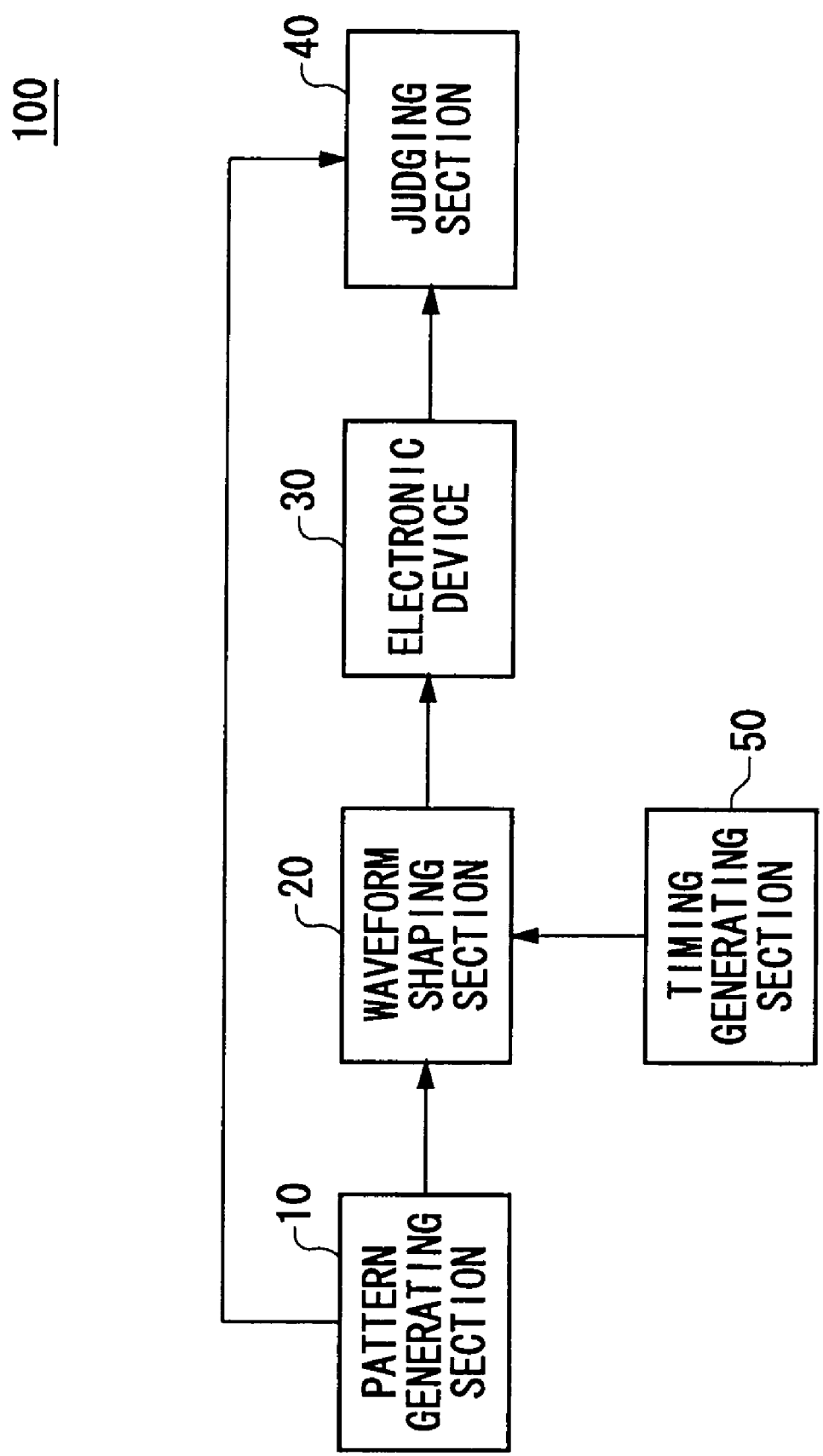
FIG. 1 is a diagram showing one exemplary configuration of a test apparatus of the invention.

FIG. 1 is a diagram showing one exemplary configuration of a test apparatus 100 of the invention. The test apparatus 100 has a pattern generating section 10, a waveform shaping section 20, a timing generator 50 and a judging section 40. The pattern generating section 10 generates a test pattern for testing an electronic device and feeds it to the waveform shaping section 20.

The timing generator 50 generates predetermined timing. The timing generator 50 has a variable delay circuit section for example. In this example, the timing generator 50 receives a reference clock, delays the received reference clock by predetermined time by the variable delay circuit section and feeds it to the waveform shaping section 20 as the predetermined timing.

The waveform shaping section 20 shapes the received test pattern and feeds the shaped test pattern to the electronic device 30. The waveform shaping section 20 may feed the test pattern to the electronic device 30 with the predetermined timing for example. In this example, the waveform shaping section 20 feeds the test pattern to the electronic device 30 corresponding to the timing received from the timing generator 50.

The judging section 40 judges whether or not the electronic device 30 is defect-free based on an output signal outputted from the electronic device 30 based on the test pattern. The judging section 40 may judge whether or not the electronic device 30 is defect-free by comparing a signal of an expected value to be outputted from the electronic device 30 based on the test pattern with the output signal outputted from the electronic device 30 for example. In this case, the pattern generating section 10 may generate the expected value signal based on the generated test pattern and may feed it to the judging section 40.

Figure 2:
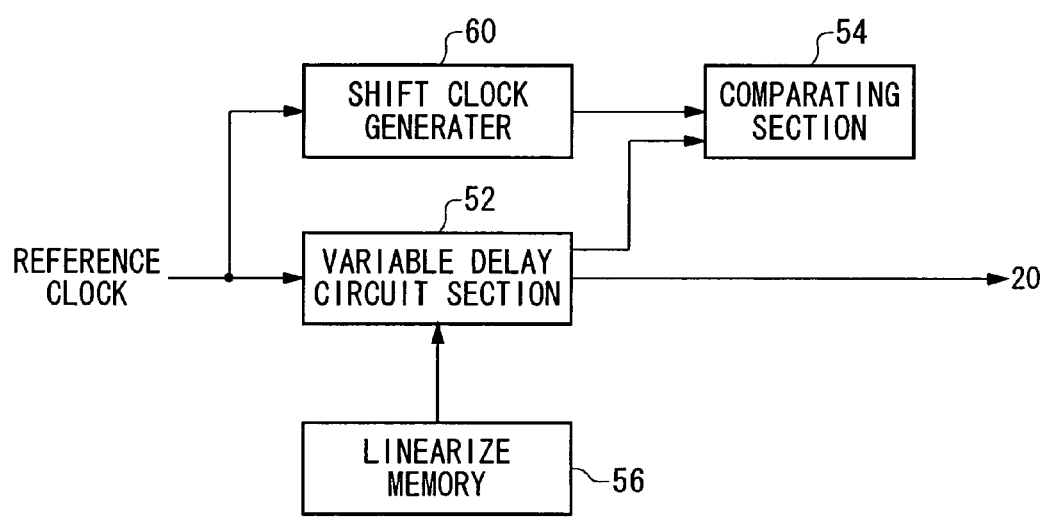
FIG. 2 is a diagram showing one exemplary configuration of a timing generating section.

FIG. 2 is a diagram showing one exemplary configuration of the timing generator 50. The timing generator 50 has the variable delay circuit section 52, a shift clock generator 60, a linearize memory 56 and a comparing section 54. The variable delay circuit section 52 receives the reference clock, delays the received reference clock based on the predetermined delay preset value and outputs it as the predetermined timing.

The variable delay circuit section 52 may have a plurality of delay elements for example. In this case, the variable delay circuit section 52 has a plurality of switches, provided corresponding to each of the plurality of delay elements, for selecting whether or not the received reference clock should be passed through the corresponding delay element. The linearize memory 56 stores data for controlling the switches of the variable delay circuit section 52 corresponding to each of the predetermined delay preset values. The variable delay circuit section 52 of this case controls each of the plurality of switches based on data corresponding to the predetermined delay preset value among the data stored in the linearize memory 56 to delay the reference clock by the predetermined delay time. For example, the linearize memory 56 may receive the delay preset value indicating a value of delay to be delayed in the variable delay circuit section 52 and may output the data corresponding to that delay preset value. Then, the variable delay circuit section 52 may control the plurality of switches based on the data outputted from the linearize memory 56.

The shift clock generator 60 receives the reference clock and generates a shift clock having a phase which is different from that of the received reference clock by a predetermined value. In this case, the shift clock generator 60 may generate the shift clock having the phase which is different from that of the reference clock by the predetermined value based on the delay preset value of the variable delay circuit section 52. For example, the shift clock generator 60 may generate such a shift clock by which the value of delay of the reference clock in the variable delay circuit section 52 matches with the phase difference of the shift clock from the reference clock.

The comparing section 54 compares the reference clock delayed by the variable delay circuit section 52 with the phase of the shift clock. The comparing section 54 may also regulate the value of delay in the variable delay circuit section 52 based on the comparison result. For example, the delay preset value of the variable delay circuit section 52 may be updated so that the reference clock delayed by the variable delay circuit section 52 matches with the phase of the shift clock. It is preferable to update the delay preset value per predetermined period of time.

Figure 3:
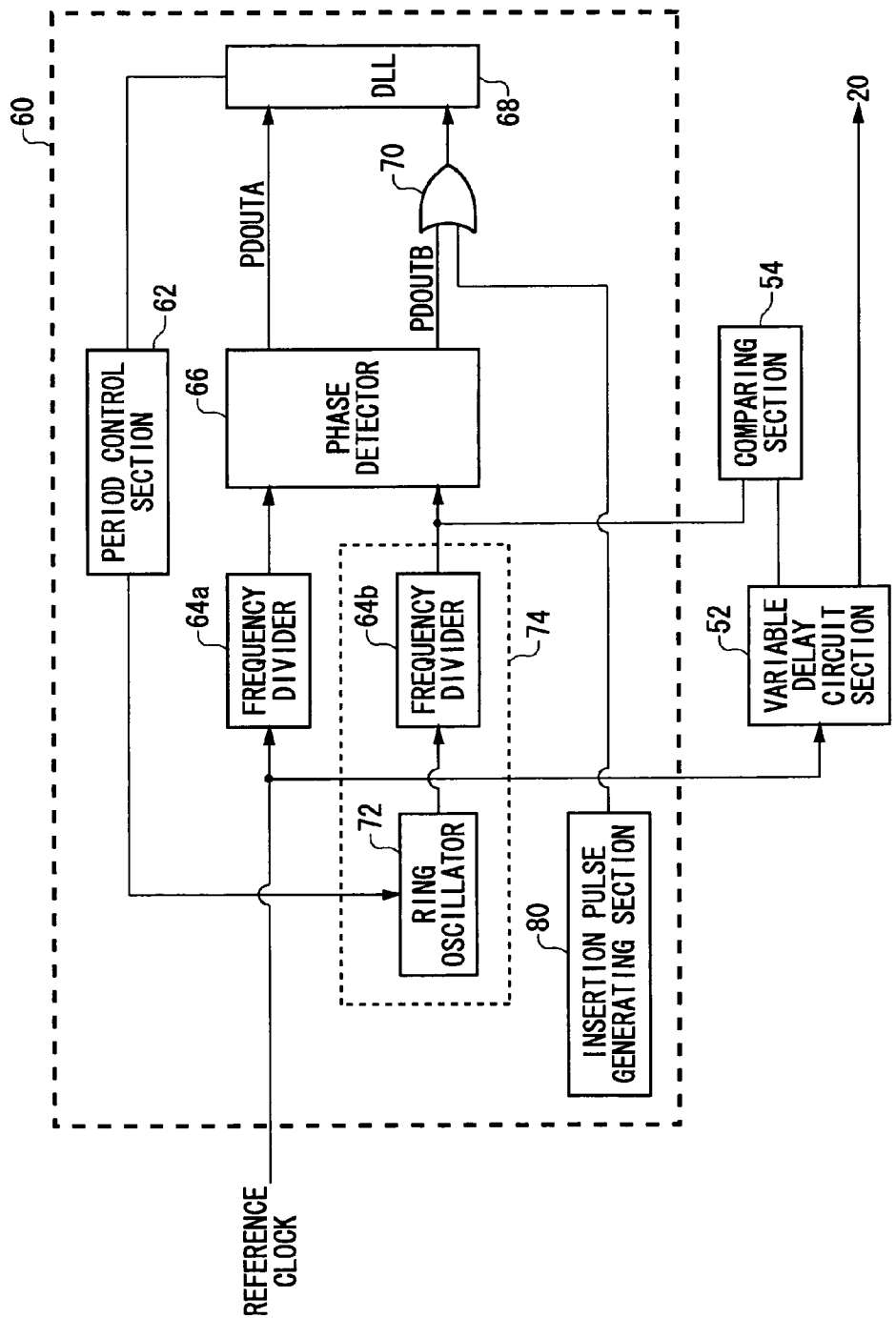
FIG. 3 is a diagram showing one exemplary configuration of a shift clock generator.

FIG. 3 is a diagram showing one exemplary configuration of the shift clock generator 60. The shift clock generator 60 has a clock generating section 74, an insertion pulse generating section 80, a pulse inserting section 70, a phase detector 66, a period control section 62 and a DLL (Delay Lock loop) 68.

The clock generating section 74 generates the shift clock. The clock generating section 74 may have a ring oscillator 72 and a frequency divider 64b for example. The ring oscillator 72 generates a clock having a predetermined period. The ring oscillator 72 has a plurality of inverters and can control the period of the clock generated by the ring oscillator 72 by controlling voltage fed to the inverters. The frequency divider 64b divides the clock generated by the ring oscillator 72 into a frequency of one-predetermined integer-th and outputs it as the shift clock.

The phase detector 66 receives the shift clock and the reference clock and outputs signals PDOUTA and PDOUTB based on the shift clock and the reference clock to the DLL 68 as the reference clock and the shift clock. In this case, the phase detector 66 receives the shift clock generated by the clock generator and the reference clock divided by the frequency divider 64b. The frequency divider 64a and the frequency divider 64b may have the same function. In this example, the phase detector 66 outputs AND of the reference clock and the shift clock as the PDOUTA. The phase detector 66 also outputs a signal that presents logic H from a rising edge of waveform of the shift clock to a rising edge of waveform the shift clock as the PDOUTB.

The DLL 68 detects a difference between a sum of time during which the reference clock presents a predetermined logical value within a predetermined time and a sum of time during which the shift clock presents a predetermined logical value within the predetermined time. In this example, the DLL 68 detects a difference between a sum of time during which the PDOUTA presents the logic H within the predetermined time and a sum of time during which the shift clock presents the logic H within the predetermined time. Still more, the predetermined time may be an integer time of the period of the divided reference clock or may be an integer time of the period of the shift clock in this example.

The period control section 62 controls the period of the shift clock generated by the clock generating section 74 based on the sum of time detected by the DLL 68. When the clock generating section 74 has the ring oscillator 72, the period control section 62 may control the period of the shift clock generated by the clock generating section 74 by controlling voltage fed to the inverters of the ring oscillator 72.

The period control section 62 may have a voltage source for feeding the voltage to the inverters of the ring oscillator 72. In an initial state, the voltage source feeds initial voltage to the inverters of the ring oscillator 72. When the sum of time during which the PDOUTA presents the logic H is longer than the sum of time during which the PDOUTB presents the logic H, the period control section 62 increases the voltage fed from the voltage source to the inverters more than the initial voltage only by the predetermined time and after an elapse of the predetermined time, returns the voltage fed by the voltage source to the inverters to the initial voltage. In this case, the period of the clock generated by the ring oscillator 72 is shortened during the predetermined time and the period is returned to the original period after the elapse of the predetermined time. Then, the phase of the clock may be shifted in a direction in which a time axis is smaller by shortening the period of the clock generated by the ring oscillator 72.

When the sum of time during the PDOUTA presents logic H is smaller than the sum of time during which the PDOUTB presents logic H, the period control section 62 lowers the voltage fed from the voltage source to the inverters than the initial voltage by the predetermined time and after the elapse of the predetermined time, returns the voltage fed from the voltage source to the inverters to the initial voltage. In this case, the period of the clock generated by the ring oscillator 72 is prolonged during the predetermined time and after the elapse of the predetermined time, the period returns to the original period. The phase of the clock may be shifted in a direction in which the time axis is larger by prolonging the period of the clock generated by the ring oscillator 72 only by the predetermined time.

The shift clock having the predetermined phase difference from the reference clock may be generated by repeating the operations described above. The shift clock generator 60 of this example generates the shift clock having the phase which is different from that of the reference clock by a predetermined value by inserting the insertion pulses into the shift clock having the predetermined phase difference and by repeating the operations described above.

The insertion pulse generating section 80 generates the insertion pulses to be inserted into the shift clock based on the phase difference preset value presenting the phase difference by which the shift clock generated by the clock generating section 74 is to be shifted. In this example, the insertion pulse generating section 80 generates the insertion pulses of a number based on the phase difference preset value. The pulse inserting section 70 inserts the insertion pulses generated by the insertion pulse generating section 80 into the shift clock generated by the clock generating section 74. The pulse inserting section 70 may be an OR circuit that outputs OR of the shift clock and the insertion pulse.

Figure 4:
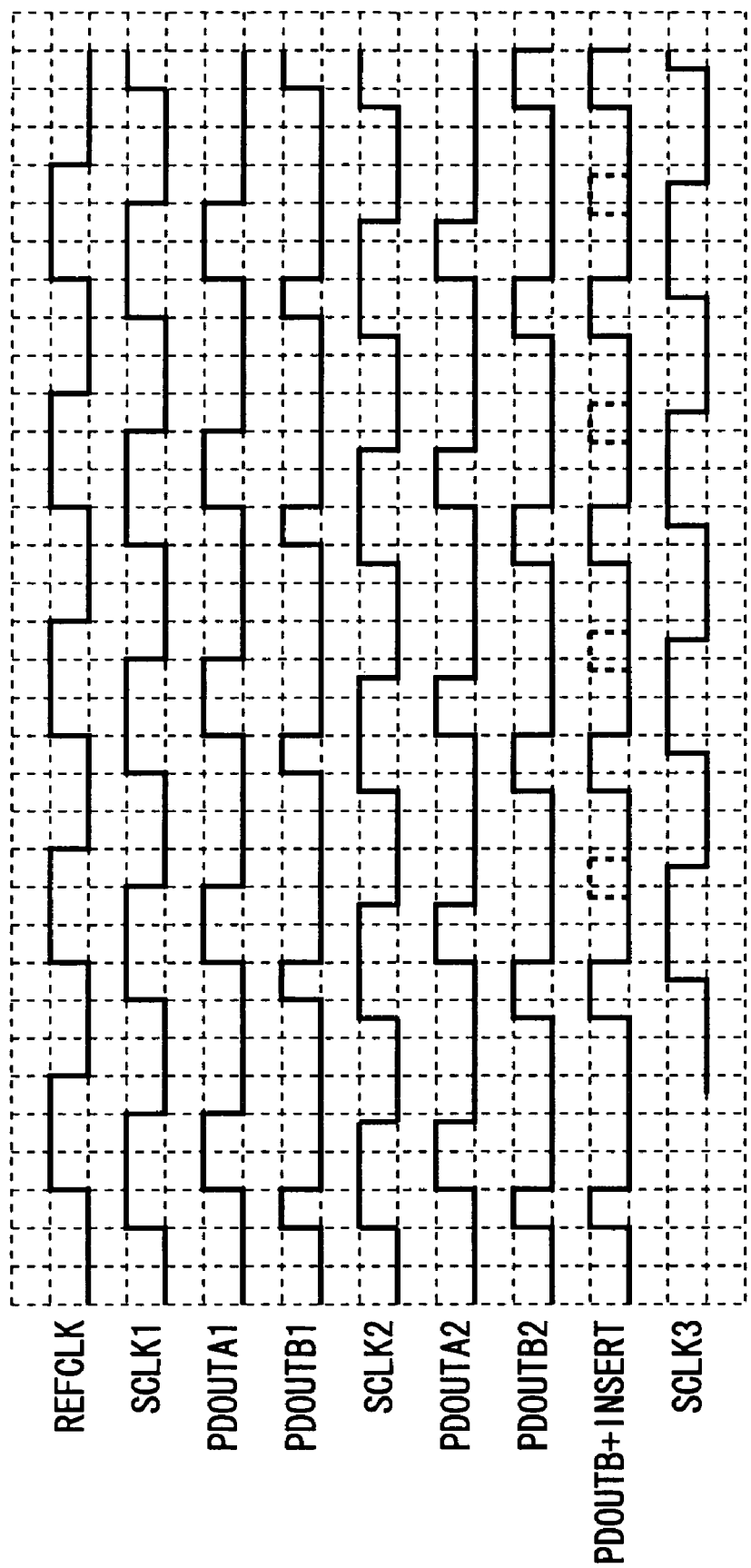
FIG. 4 is a timing chart showing one exemplary operation of the shift clock generator.

FIG. 4 is a timing chart showing one exemplary operation of the shift clock generator 60. In FIG. 4, an axis of abscissa represents time, a REFCLK stage represents the reference clock outputted from the frequency divider 64a, SCLK1, SCLK2 and SCLK3 stages represent the shift clocks generated by the clock generating section 74 (see FIG. 3), PDOUTA1 and PDOUTB2 stages represent PDOUTA outputted from the phase detector 66 (see FIG. 3), PDOUTB1 and PDOUTB stages represent the PDOUTB outputted from the phase detector 66 and a PDOUTB+INSERT stage represents PDOUTB into which the insertion pulses outputted from the pulse inserting section 70 are inserted.

In this example, the REFCLK and SCLK1 stages show the initial state of the reference clock and shift clock, respectively. Receiving the reference clock and the shift clock, the phase detector 66 outputs the PDOUTA and PDOUTB shown in the PDOUTA1 and PDOUTB1 stages. The phase detector 66 outputs AND of the reference clock and the shift clock as PDOUTA as described above (PDOUTA1). The phase detector 66 also outputs logic H from the rising edge of the shift clock to the rising edge of reference clock as the PDOUTB (PDOUTB1).

The DLL 68 compares the sum of time during which the PDOUTA1 presents logic H within the predetermined time with the sum of time during which the PDOUTB1 presents logic H within the predetermined time as described above. The predetermined time may be a time of integer times of the reference clock outputted from the frequency divider 64a. The period control section 62 regulates the period of the clock generated by the ring oscillator 72 based on the difference of sums during which the PDOUTA1 and PDOUTB1 present logic H. Because the sum of time during which the PDOUTA1 presents logic H is longer than the sum of time during which the PDOUTB1 presents logic H in this case, the period control section 62 shortens the period of the clock generated by the ring oscillator 72 only by the predetermined time. The predetermined time may be a time of one period of the shift clock outputted from the frequency divider 64b. In this case, the period of the shift clock is shortened only one cycle and the period returns to the original period on and after the second cycle. Therefore, the phase of the shift clock on after the second cycle may be shifted. Repeating such operations stabilizes the shift clock so as to have a phase having a predetermined phase difference from the reference clock. One example of the shift clock in the stable state is shown on and after the second cycle of the SCLK2 stage.

The PDOUTA and PDOUTB in the stable state are shown on and after the second cycle of the PDOUTA2 and PDOUTB2 stages. The sum of time during which the PDOUTA2 presents logic H and the sum of time during which the PDOUTB presents logic H is almost equal.

Next, the PDOUTB+INSERT stage presents a signal in which the insertion pulses generated by the insertion pulse generating section 80 are inserted into the PDOUTB in the stable state. Pulses indicated by broken lines are insertion pulses. There arises a difference between the sum of time during which the PDOUTA presents logic H and the sum of time during which the PDOUTB presents logic H by inserting the insertion pulses and the period control section 62 shifts the phase of the shift clock so as to eliminate the difference. The SCLK3 stage presents the phase-shifted shift clock. The shift clock having the predetermined phase difference from the reference clock may be readily generated by controlling a number of pulses and pulse length of the insertion pulses inserted into the PDOUTB.

Figure 5:
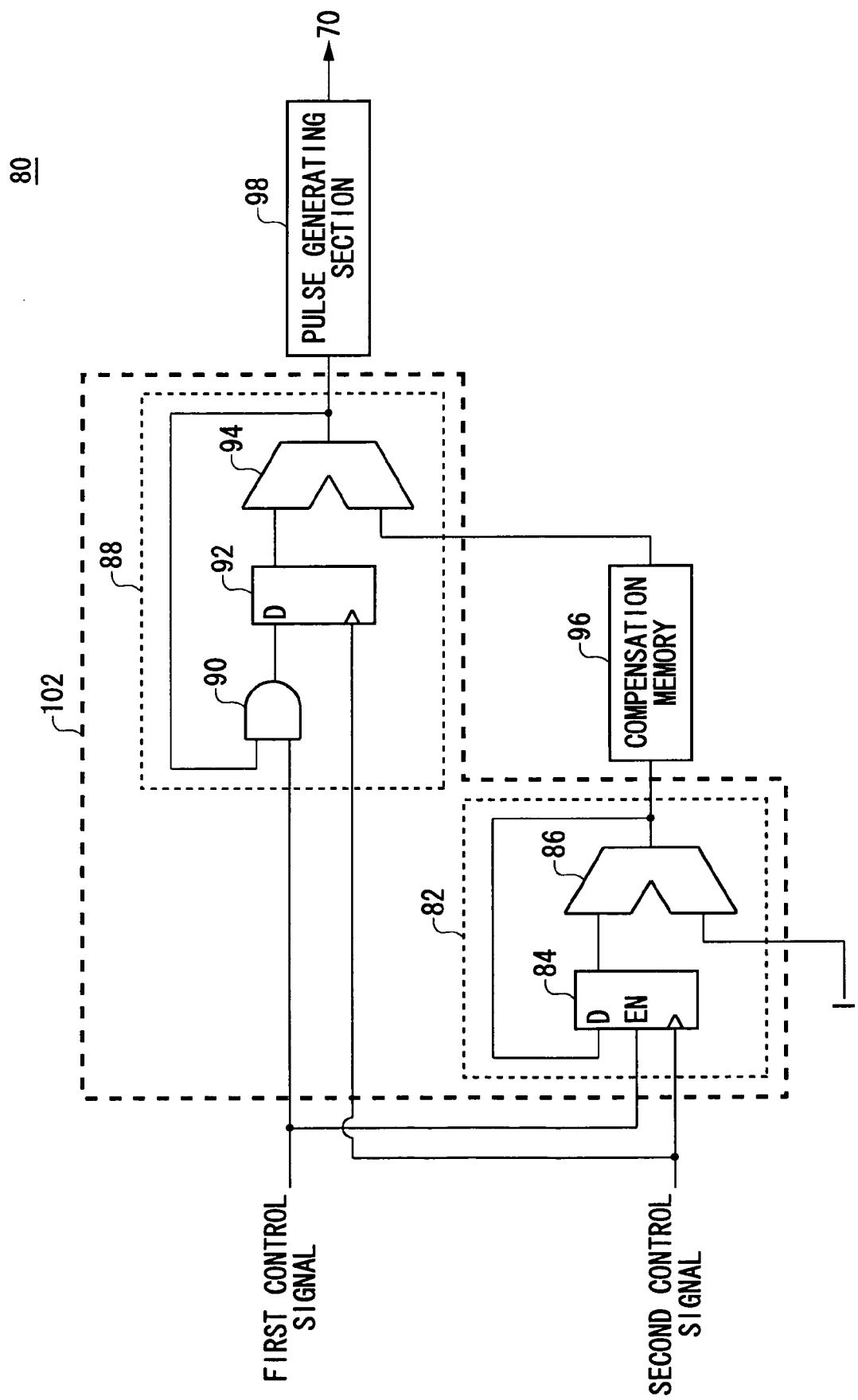
FIG. 5 is a diagram showing one exemplary configuration of an insertion pulse generating section.

FIG. 5 is a diagram showing one exemplary configuration of an insertion pulse generating section 80. The insertion pulse generating section 80 has a compensation memory 96, a number-of-pulses counting section 102 and a pulse generating section 98. The compensation memory 96 stores compensation data for calculating the number of insertion pulses to be inserted into the shift clock with respect to the phase difference preset value. The compensation memory 96 may store the compensation data presenting a predetermined integer in each address. In this example, the compensation memory 96 stores the compensation data of two bits in each address. For example, the compensation memory 96 stores the data presenting either one of 0, 1 and 2 in each address.

The number-of-pulses counting section 102 calculates data on a number of insertion pulses by integrating the compensation data stored in the address range of the compensation memory 96 based on the phase difference preset value. The number-of-pulses counting section 102 receives a first control signal based on the phase difference preset value and a second control signal based on the predetermined clock signal and integrates the compensation data stored in the address range of the compensation memory 96 based on the first and second control signals. In this example, the second control signal may be either one of the reference clock, the reference clock divided by the frequency divider 64a, the clock generated by the ring oscillator 72 and the shift clock. Still more, the first control signal may be a signal that presents logic H only during a time based on the phase difference preset value in this example. For example, when the shift clock is to be phase-shifted by 10 ps (pico-seconds) and when a theoretical value of a number of insertion pulses to be inserted is 10, the first control signal may be a signal that presents logic H only during 10 periods of the second control signal.

The pulse generating section 98 generates the insertion pulses based on the data on the number of insertion pulses calculated by the number-of-pulses counting section 102. The pulse generating section 98 generates a number of pulses based on the data on the number of insertion pulses at desired time intervals and feeds the insertion pulses thus generated to the pulse inserting section 70. When the pulse inserting section 70 outputs OR of the shift clock and the insertion pulse, preferably the pulse generating section 98 generates insertion pulses whose logic H region does not overlap with the logic H region of the shift clock. Still more, preferably the pulse generating section 98 generates insertion pulses that are inserted almost evenly between each pulse of the PDOUTB outputted from the phase detector 66 as the shift clock. Because the pulse generating section 98 generates the insertion pulses that are inserted almost evenly between each pulse of the PDOUTB, the shift clock generator 60 can almost equalize exothermic value caused by the shift clock into which the insertion pulses are inserted per unit time.

In this example, the number-of-pulses counting section 102 has an address control section 82 and an integrating section 88. The address control section 82 sequentially generates address pointer signals pointing addresses in the compensation memory 96 in which the compensation data is being stored based on the phase difference preset value.

The address control section 82 may have a first adder 86 and a first storage section 84 as shown in FIG. 5. The first adder 86 feeds the address pointer signals to the compensation memory 96. The first storage section 84 stores the address pointer signals outputted from the first adder 86. The address control section 82 also receives the first and second control signals described above. When the first control signal presents a predetermined value, the first storage section 84 feeds the stored address pointer signals sequentially to the first adder 86 corresponding to changes of the value of the second control signal. In this example, when the first control signal presents logic H, the first storage section 84 feeds the stored address pointer signals sequentially to the first adder 86 corresponding to a rising edge of the waveform of the second control signal. For example, the first storage section 84 may be a flip-flop that receives the address pointer signal from the first adder 86, outputs the address pointer signal received from the first adder 86 to the first adder 86 by being triggered by the second control signal and receives the first control signal as an enable signal for controlling the operation of the first storage section 84. The address pointer signal specifying an address 0 is stored in the flip-flop as an initial value.

The first adder 86 generates a signal in which a predetermined value is added to the address pointer signal received from the first storage section 84 as a new address pointer signal and feeds the newly generated address pointer signal to the compensation memory 96 and the first storage section 84. In this example, the first adder 86 adds 1 as the predetermined value to the address pointer signal. The address control section 82 feeds the address pointer signal that increases by one each from a predetermined address sequentially to the compensation memory 96 based on the second control signal in this example.

In this example, the first storage section 84 feeds the stored address pointer signal to the first adder 86 per rising edge of the waveform of the second control signal during the period of time when the first control signal presents logic H. The first adder 86 adds 1 to the received address pointer signal and feeds it to the compensation memory 96. The compensation memory 96 feeds the compensation data in the address range based on the phase difference preset value from the predetermined address sequentially to the integrating section 88. Although the address control section 82 of this example has the first storage section 84 and the first adder 86, the address control section 82 may have a counter for counting rising or falling edges of the waveform of the second control signal to output a counted number in another example. In this case, the counter receives the first control signal as an enable signal for controlling the operation of the counter.

The compensation memory 96 feeds the compensation data stored in the addresses corresponding to the address pointer signals sequentially received from the address control section 82 sequentially to the integrating section 88. The integrating section 88 integrates the compensation data outputted sequentially out of the compensation memory 96 based on the address pointer signals. In this example, the integrating section 88 has a second adder 94 and a second storage section 92. The second adder 94 receives the compensation data sequentially outputted from the compensation memory 96 and outputs integrated data obtained by integrating the compensation data.

The second storage section 92 stores the integrated data outputted from the second adder 94. When the first control signal presents a predetermined value, the second storage section 92 feeds the stored integrated data to the second adder 94 corresponding to changes of the value of the second control signal. The integrating section 88 may further include an AND circuit 90 that outputs AND of the first control signal and the integrated data outputted from the second adder 94. The second storage section 92 may be a flip-flop that receives AND of the first control signal and the integrated data outputted from the second adder 94 from the AND circuit 90 and that outputs AND of the first control signal and the integrated data outputted from the second adder 94 to the second adder 94 by being triggered by the second control signal. In this example, the first storage section 84 and the second storage section 92 operate in synchronism.

The second adder 94 adds new compensation data outputted from the compensation memory 96 corresponding to a new address pointer signal to the integrated data received from the second storage section 92 and outputs it as new integrated data to the AND circuit 90 and the pulse generating section 98. The number-of-pulses counting section 102 explained in this example allows the compensation data stored in the address range of the compensation memory 96 corresponding to the phase difference preset value to be integrated and to be fed to the pulse generating section 98.

FIG. 6 is a table showing one exemplary compensation data stored in the compensation memory 96. The compensation memory 96 stores the compensation data that presents a predetermined integer per address. In this example, the compensation memory 96 stores the compensation data that presents 0, 1 or 2. The integrating section 88 (see FIG. 5) integrates the compensation data in the address range based on the phase difference preset value.

Figure 7:
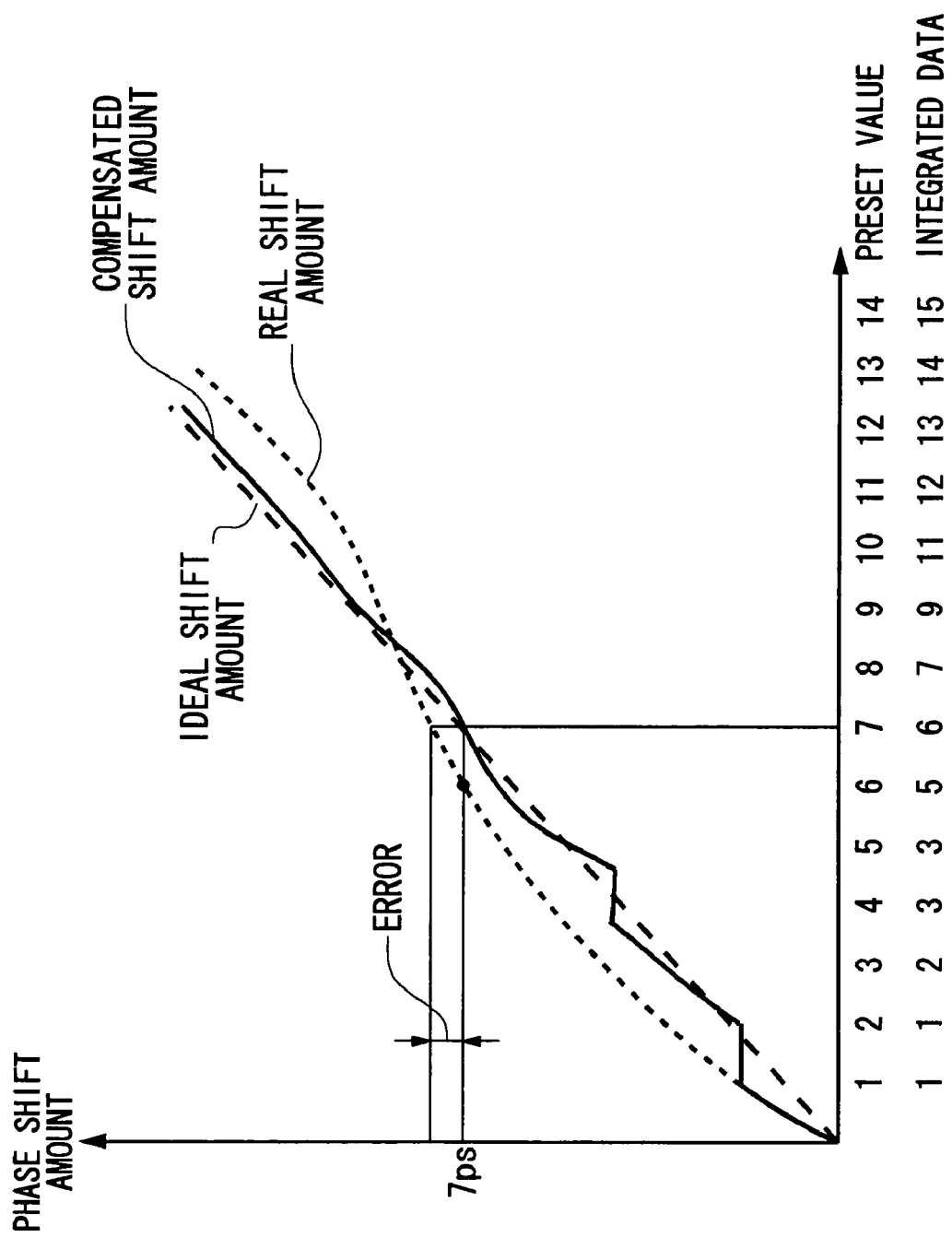
FIG. 7 is a graph showing one exemplary relationship between a number of insertion pulses and a phase shift amount of a shift clock.

FIG. 7 is a graph showing one exemplary relationship between a number of insertion pulses and a phase shift amount of a shift clock. In FIG. 7, an axis of abscissa represents the numbers of insertion pulses and an axis of ordinate represents the values of phase shift. In FIG. 7, an ideal shift amount represented by a broken line indicates a value of shift by which the shift clock is to be shifted with respect to a number-of-insertion-pulses preset value, an actual value of shift represented by another broken line indicates a value of shift by which the shift clock is actually shifted with respect to the number of insertion pulses preset value and a compensated shift amount represented by a solid line indicates a value of shift by which the value of shift of the shift clock is compensated by compensating the number of insertion pulses.

The shift clock generator 60 of the present embodiment shifts the shift clock by predetermined phase by controlling the number of insertion pulses to be inserted into the shift clock. The number of insertion pulses is controlled by the compensation data stored in the compensation memory 96. In the present embodiment, the compensation memory 96 stores the compensation data shown in FIG. 6. When the compensation memory 96 stores the compensation data shown in FIG. 6, the integrating section 88 (see FIG. 5) sequentially outputs integrated data shown in FIG. 7 as the integrated data.

When the shift clock is to be phase-shifted by 7 ps, an ideal value of the number of insertion pulses to be inserted is supposed to be 7 as shown in FIG. 7 for example. However, because the actual value of shift has an error as against the ideal shift amount as shown in FIG. 7, the value of shift becomes erroneous when 7 pulses of insertion pulse are inserted into the shift clock. Therefore, the insertion pulse generating section 80 (see FIG. 3) of the invention stores the compensation data for compensating the error in the compensation memory 96. Because the insertion pulse generating section 80 of the invention calculates the integrated data per number of insertion pulses to be inserted corresponding to the phase difference preset value to compensate-the number of insertion pulses-, the phase shift amount of the shift clock may be accurately controlled even when the actual value of shift does not change linearly as shown in FIG. 7.

Still more, each of the integrated data may be stored in each address of the compensation memory 96 and the pulse generating section 98 may generate the insertion pulses based on the integrated data stored in the compensation memory 96. However, when the number-of-insertion pulses preset value takes one to several thousands ranges for example, the integrated data to each number of insertion pulses preset value must be stored in each address in the compensation memory 96 and the compensation memory 96 must store the integrated data of ten-odd bits in each address range of one to several thousands. The insertion pulse generating section 80 explained in connection with FIGS. 5 through 7 only requires the compensation memory 96 to store the compensation data of several bits in each of one to several thousands address ranges. For example, as explained in connection with FIG. 6, the compensation memory 96 is only required to store the compensation data of 2 bits in each address in storing the compensation data of 0, 1 or 2. Therefore, the insertion pulse generating section 80 as explained in connection with FIGS. 5 through 7 allows the number of memory bits of the compensation memory 96 to be remarkably reduced.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

INDUSTRIAL APPLICABILITY

As it is apparent from the above description, the invention allows a memory capacity to be reduced and the shift clock whose phase shift amount is accurately controlled to be generated. Still more, the timing generator can generate the predetermined timing accurately because the value of delay of the variable delay circuit section may be regulated based on the accurate shift clock. Furthermore, because the test apparatus can carry out the test of the electronic device by using the accurate and predetermined timing, it can accurately test the electronic devices.

What is claimed is:

1. A shift clock generator for generating a shift clock having a phase which is different from that of a reference clock by a predetermined value, comprising:
   a clock generating section for generating said shift clock;
   an insertion pulse generating section for generating insertion pulses to be inserted into said shift clock based on said phase difference preset value;
   a pulse inserting section for inserting said insertion pulses into said shift clock generated by said clock generating section; and
   a period control section for controlling periods of said shift clock generated by said clock generating section based on a difference between a sum of time during which said reference clock presents a predetermined logical value within a predetermined time and a sum of time during which said shift clock presents a predetermined logical value within said predetermined time; wherein
   said insertion pulse generating section comprises:
   a compensation memory for storing compensation data for calculating a number of insertion pulses to be inserted into said shift clock with respect to said phase difference preset value;
   a number-of-pulses calculating section for integrating said compensation data stored in an address range of said compensation memory to calculate number-of-insertion pulses data based on said phase difference preset value; and
   a pulse generating section for generating said insertion pulses based on said number-of-insertion pulses data.

2. The shift clock generator as set forth in claim 1, wherein said compensation memory stores said compensation data presenting a predetermined integer in each address.

3. The shift clock generator as set forth in claim 1, wherein said number-of-pulses calculating section has an address control section for sequentially generating address pointer signals specifying addresses of said compensation memory in which said compensation data is stored based on said phase difference preset value; and
   an integrating section for integrating said compensation data outputted from said compensation memory based on said address pointer signals.

4. The shift clock generator as set forth in claim 3, wherein said address control section includes a first adder for feeding said address pointer signals to said compensation memory and a first storage section for storing said address pointer signals outputted from said first adder; and receives a first control signal based on said phase difference preset value and a second control signal based on a predetermined clock signal; wherein said first storage section sequentially feeds said stored address pointer signals to said first adder corresponding to changes of value of said second control signal when said first control signal presents a predetermined value; and said first adder generates a signal in which a predetermined value is added to said address pointer signal received from said first storage section as a new address pointer signal and feeds said newly generated address pointer signal to said compensation memory and said first storage section.

5. The shift clock generator as set forth in claim 4, wherein said predetermined clock signal is said reference clock or said shift clock.

6. The shift clock generator as set forth in claim 5, wherein said integrating section includes a second adder for receiving said compensation data sequentially outputted from said compensation memory to output integrated data in which said compensation data is integrated and a second storage section for storing said integrated data outputted from said second adder; wherein said second storage section feeds said stored integrated data to said second adder corresponding to changes of value of said second control signal when said first control signal presents a predetermined value; and said second adder adds said new compensation data outputted from said compensation memory corresponding to said new address pointer signal to said integrated data received from said second storage section and outputs it as said new integrated data.

7. The shift clock generator as set forth in claim 6, wherein said first storage section is a flip-flop that receives said address pointer signal from said first adder, outputs said address pointer signal received from said first adder to said first adder by being triggered by said second control signal and receives said first control signal as an enable signal for controlling the operation of said first storage section; and said second storage section is a flip-flop that receives AND of said first control signal and said integrated data outputted from said second adder and outputs AND of said first control signal and said integrated data outputted from said second adder to said second adder by being triggered by said second control signal.

8. A timing generator for generating predetermined timing, comprising:

a variable delay circuit section for receiving a reference clock and delaying said reference clock based on a predetermined delay preset value to output as said predetermined timing;

a shift clock generator for generating a shift clock having a phase difference equal to a phase difference preset value based on said delay preset value from said reference clock; and a comparing section for comparing said reference clock delayed by said variable delay circuit section with a phase of said shift clock to regulate the value of delay in said variable delay circuit section based on the comparison result; wherein said shift clock generator has:

a clock generating section for generating said shift clock;

an insertion pulse generating section for generating insertion pulses to be inserted into said shift clock based on said phase difference preset value;

a pulse inserting section for inserting said insertion pulses into said shift clock generated by said clock generating section; and a period control section for controlling period of said shift clock generated by said clock generating section based on a difference between a sum of time during which said reference clock presents a predetermined logical value within a predetermined time and a sum of time during which said shift clock presents a predetermined logical value within said predetermined time; wherein said insertion pulse generating section comprises:

a compensation memory for storing compensation data for calculating a number of insertion pulses to be inserted into said shift clock with respect to said phase difference preset value;

a number-of-pulses calculating section for integrating said compensation data stored in an address range of said compensation memory to calculate number-of-insertion pulses data based on said phase difference preset value; and a pulse generating section for generating said insertion pulses based on said number-of-insertion pulses data.

9. A test apparatus for testing an electronic device, comprising:

a pattern generating section for generating a test pattern for testing said electronic device;

a timing generator for generating predetermined timing;

a waveform shaping section for shaping said test pattern to feed said test pattern shaped based on said predetermined timing to said electronic device; and a judging section for judging whether or not said electronic device is defect-free based on an output signal outputted from said electronic device based on said test pattern; wherein said timing generator comprises a variable delay circuit section for receiving a reference clock and delaying said reference clock based on a predetermined delay preset value to output as said predetermined timing;

a shift clock generator for generating a shift clock having a phase difference equal to a phase difference preset value based on said delay preset value to said reference clock; and a comparing section for comparing said reference clock delayed by said variable delay circuit section with a phase of said shift clock to regulate the value of delay in said variable delay circuit section based on the comparison result; wherein said shift clock generator has:

a clock generating section for generating said shift clock;

an insertion pulse generating section for generating insertion pulses to be inserted into said shift clock based on said phase-difference preset value;

a pulse inserting section for inserting said insertion pulses into said shift clock generated by said clock generating section; and a period control section for controlling period of said shift clock generated by said clock generating section based on a difference between a sum of time during which said reference clock presents a predetermined logical value within a predetermined time and a sum of time during which said shift clock presents a predetermined logical value within said predetermined time; wherein said insertion pulse generating section comprises:

a compensation memory for storing compensation data for calculating a number of insertion pulses to be inserted into said shift clock with respect to said phase difference preset value;

a number-of-pulses calculating section for integrating said compensation data stored in an address range of said compensation memory to calculate number-of-insertion pulses data based on said phase difference preset value; and a pulse generating section for generating said insertion pulses based on said number-of-insertion pulses data.

10. The shift clock generator as set forth in claim 2, wherein said number-of-pulses calculating section has an address control section for sequentially generating address pointer signals specifying addresses of said compensation memory in which. said compensation data is stored based on said phase difference preset value; and an integrating section for integrating said compensation data outputted from said compensation memory based on said address pointer signals.

* * * * *